United States Patent
Maeda

(10) Patent No.: US 6,241,869 B1
(45) Date of Patent: Jun. 5, 2001

(54) APPARATUS AND METHOD FOR ELECTROPLATING

(75) Inventor: Keiichi Maeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/296,297

(22) Filed: Apr. 22, 1999

(30) Foreign Application Priority Data

Apr. 24, 1998 (JP) .................................................. 10-114494

(51) Int. Cl.$^7$ .............................. C25D 5/00; C25D 7/12; C25D 5/54; C25D 5/34; C25D 5/02
(52) U.S. Cl. .................. 205/137; 205/157; 205/159; 205/205; 205/224; 205/118; 205/123
(58) Field of Search ..................... 205/157, 159, 205/137, 205, 224, 118, 123; 427/248.1, 294, 383.1

(56) References Cited

U.S. PATENT DOCUMENTS

| | | | |
|---|---|---|---|
| 5,273,642 | * | 12/1993 | Crites et al. .......................... 205/118 |
| 5,763,953 | * | 6/1998 | Iijima et al. .......................... 257/762 |

FOREIGN PATENT DOCUMENTS 4-131395 * 5/1992 (JP) .

* cited by examiner

*Primary Examiner*—Edna Wong
(74) *Attorney, Agent, or Firm*—Ronald P. Kananen; Rader, Fishman & Grauer

(57) ABSTRACT

An apparatus and a method for electroplating for forming a metal film by an electroplating method. The apparatus comprises a plating bath provided in a non-oxidative atmosphere, and in the method, an article to be plated is immersed in a plating bath through a non-oxidative atmosphere.

7 Claims, 6 Drawing Sheets

APPARATUS AND METHOD FOR ELECTROPLATING

FIELD OF THE INVENTION

The present invention relates to an apparatus for electroplating and a method for electroplating, and particularly it relates to an apparatus for electroplating and a method for electroplating, in-which copper is formed into a film in a semiconductor device by electroplating.

BACKGROUND OF THE INVENTION

With high integration of an LSI (large scale integrated) circuit, internal interconnection is becoming minute and multi-layered. Along with such a tendency, development of a flattening technique on formation of interconnection, and a processing technique for minute interconnection, and maintenance of reliability become important problems. As one of the solutions to these problems, embedded interconnection technique has been investigated. In particular, a copper embedded interconnection technique aiming at high speed operation and low consumption power is receiving attention.

Formation of a copper film by an electroplating method receives attention as a recent method of copper embedding. In this method, a barrier metal layer is formed in a groove or a connecting hole, and then a copper film is formed by an electroplating method using a copper sulfate solution. In this case, a copper film is often formed by a sputtering method or a CVD (chemical vapor deposition) method on the barrier metal layer and used as a glue layer. The electroplating method realizes embedding in a high aspect structure at room temperature.

However, the conventional technique described above involves the following problems. The process of embedding copper in a groove or a connecting hole by electroplating of copper is described below. As shown in FIG. 1A, a concave part 112 comprising the groove and the connecting hole is formed in an interlayer insulating film 111 by an ordinary RIE (reactive ion etching) method. As shown in FIG. 1B, a barrier metal layer 113 is formed on the inner wall of the concave part 112 and on the interlayer insulating film 111 by forming, for example, a titanium film and a titanium nitride film, as a laminated film, in this order from the lower layer, for example, by a sputtering method, and then a glue layer 114 is further formed thereon. At this time, the barrier metal layer 113 and the glue layer 114 are formed at the opening parts of the concave part 112 in the form of overhang.

As shown in FIG. 1C, because the coverage of the barrier metal layer 113 and the glue layer 114 on the concave part 112 does not become 100%, the resistance of the barrier metal layer 113 and the glue layer 114 is increased at these parts. Under the circumstances, when electroplating is conducted by immersing in a copper electroplating solution 121, current concentration occurs at the opening part (shown by arrows in the figure). The rate of the film formation is thus increased at the part at which current concentration occurs. A bubble 115 is formed inside the concave part 112. As a result, a copper film 116 is formed with a void 115 forming inside the concave part 112, as shown in FIG. 1D. In FIG. 1C, the figure is drawn with the upper surface of the interlayer insulating film 111 being downward on the contrary to the other figures.

FIG. 2 is a schematic cross sectional view showing the voids actually formed on producing a copper film by electroplating. As shown in FIG. 2, it has been found that the copper film 116 is grown in the condition that the voids 115 are formed over the interior to the upper part of the concave parts (grooves) 112 formed in the interlayer insulating film 111.

In the electroplating apparatus 120 for a wafer currently available as shown in FIG. 3, in order to prevent the back surface of the wafer 110 from contacting with a plating solution (containing copper ions) 121, a face-down structure is employed in that the front surface of the wafer 110 faces the plating solution 121. The plating solution is stored in a plating bath 122, and an anode 123 is provided in the plating solution 121.

In the method described above, there is a case where the plating solution 121 cannot be spread into minute parts formed on the surface of the wafer 110 as shown in FIG. 4A. That is, there is a case where a bubble 117 remains inside the concave part (for example, a groove) 112. When electroplating is conducted under such conditions, the copper film 116 is grown in the condition in that the bubble 117 remains and a void 115 is formed inside the concave part 112, as shown in FIG. 4B.

It has been reported by Y. Harada, et al. in *Preprints of 58th Shuki Gakujutu Koenkai of the Japan Society of Applied Physics*, 3p-E-4, p. 776 (1997) that the void thus formed is avoided by subjecting to a heat treatment at about 400° C. However, a void generated by forming a film by electroplating contains air as different from a void generated by sputtering under high vacuum. Since the air contains about 20% of oxygen, there is a possibility that the surroundings of the void are oxidized, and increase in resistance and deterioration of reliability may occur.

SUMMARY OF THE INVENTION

The invention relates to an apparatus for electroplating and a method for electroplating that solve the problems described above, and in the apparatus for electroplating, a plating bath is provided in a non-oxidative atmosphere, such as a rare gas atmosphere, a nitrogen gas atmosphere and a hydrogen gas atmosphere.

Because the plating bath is provided in a non-oxidative atmosphere in the apparatus for electroplating, even when a bubble invades into the minute part, such as a groove and a connecting hole, of the article to be plated on immersing the article into a plating solution in the plating bath, so as to form a plated layer with the bubble becoming a void, the void contains a non-oxidative gas but does not contain oxygen. Therefore, the plated layer is not oxidized when the gas contained in the void is absorbed by the plated layer by subjecting the plated layer to the heat treatment to disappear the void. Thus, increase in resistance and deterioration of reliability in the plated layer do not occur.

In the method for electroplating according to the invention, an article to be plated is immersed in a plating solution through a non-oxidative atmosphere, such as a rare gas atmosphere, a nitrogen gas atmosphere and a hydrogen gas atmosphere.

Because the article to be plated is immersed in the plating solution through the non-oxidative atmosphere, even when a bubble invades into the minute part, such as a groove and a connecting hole, of the article to be plated on immersing the article into a plating solution, so as to form a plated layer with the bubble becoming a void, the void does not contain oxygen. Therefore, the plated layer is not oxidized when the gas contained in the void is absorbed by the plated layer by subjecting the plated layer to the heat treatment to cause the void to disappear. Thus, increase in resistance and deterioration of reliability in the plated layer do not occur.

DESCRIPTION OF PREFERRED EMBODIMENTS

The first embodiment of the apparatus for electroplating according to the invention will be described with reference to the schematic diagram shown in FIG. 5.

Figure 1A:
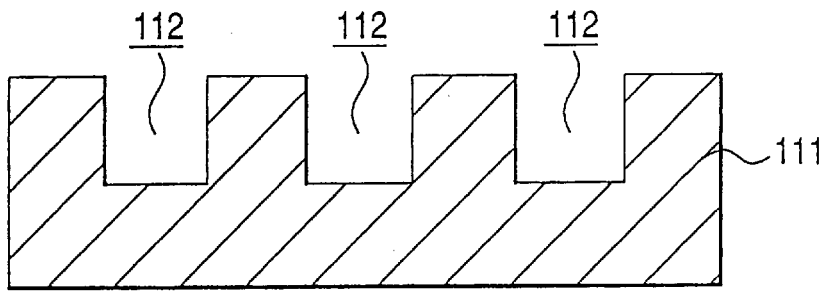
FIGS. 1A to 1D are schematic cross sectional views showing a conventional embedding process into a groove or a connecting hole by electroplating of copper.
Figure 1B:
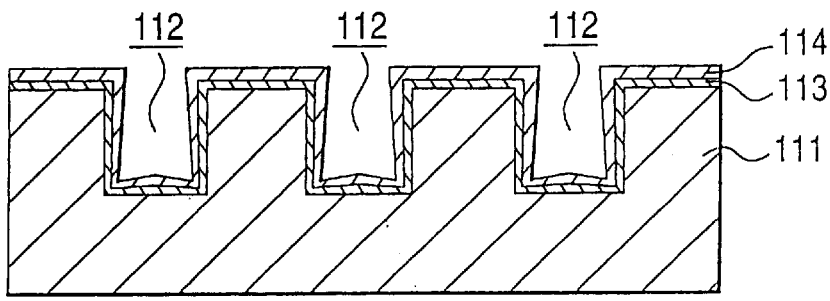
Figure 1C:
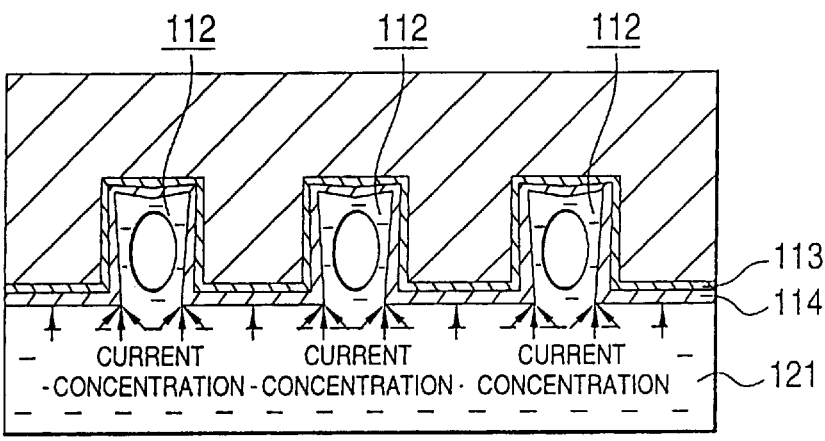
Figure 1D:
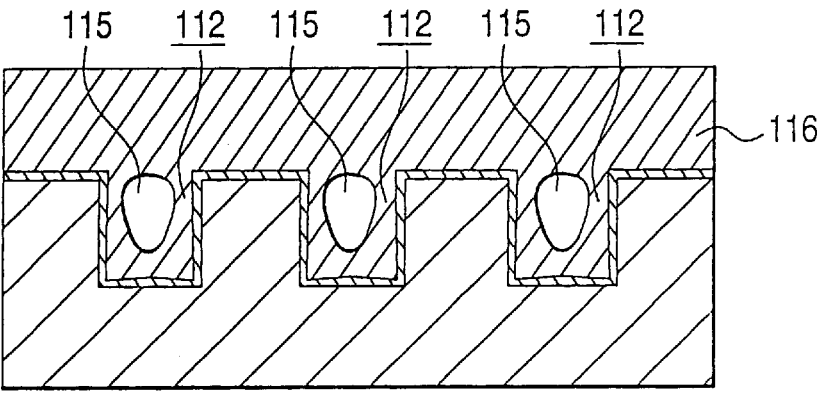
Figure 2:
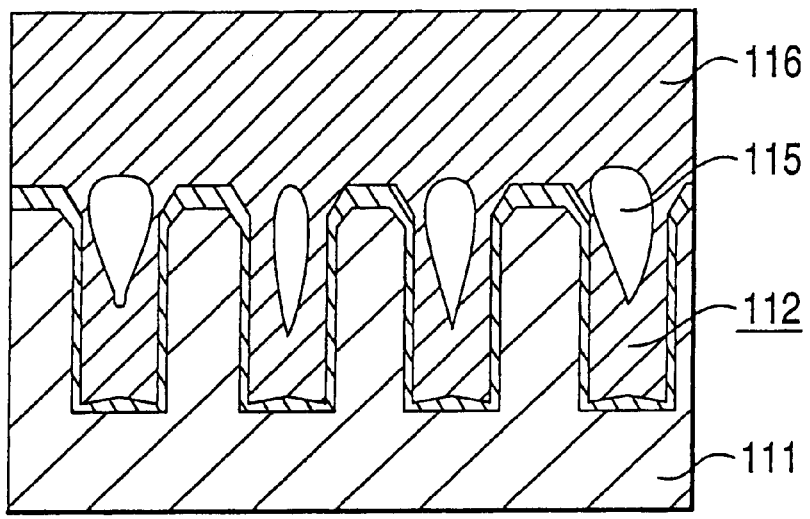
FIG. 2 is a schematic cross sectional view showing a void generated on forming a copper film by electroplating.
Figure 3:
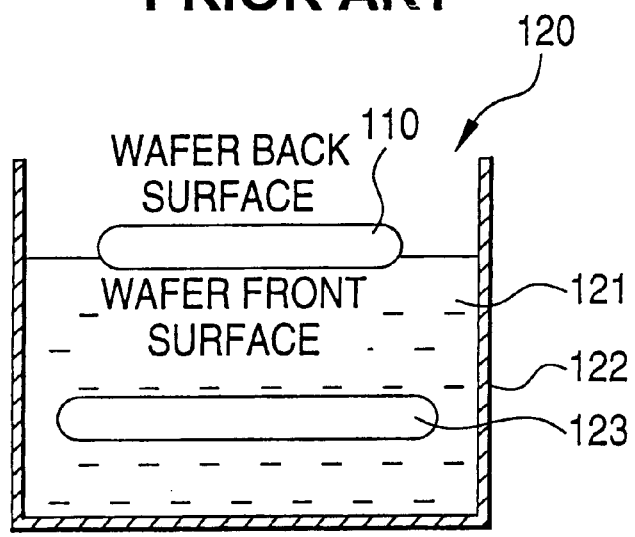
FIG. 3 is a schematic diagram showing a conventional apparatus for electroplating for a wafer.
Figure 4A:
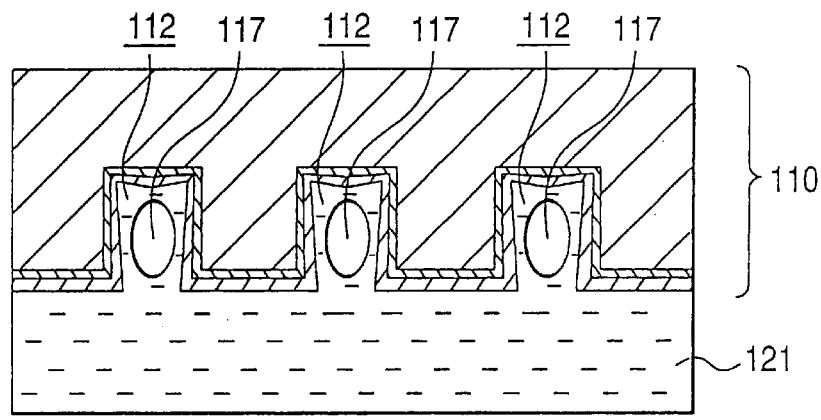
FIGS. 4A and 4B are schematic cross sectional view for describing the problems associated with the conventional method for electroplating.
Figure 4B:
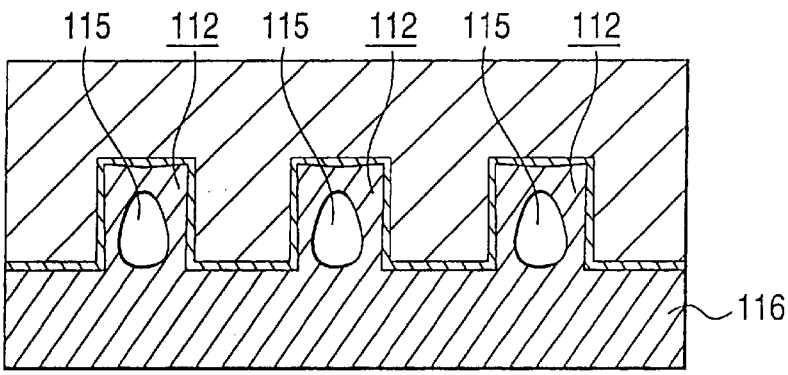
Figure 5:
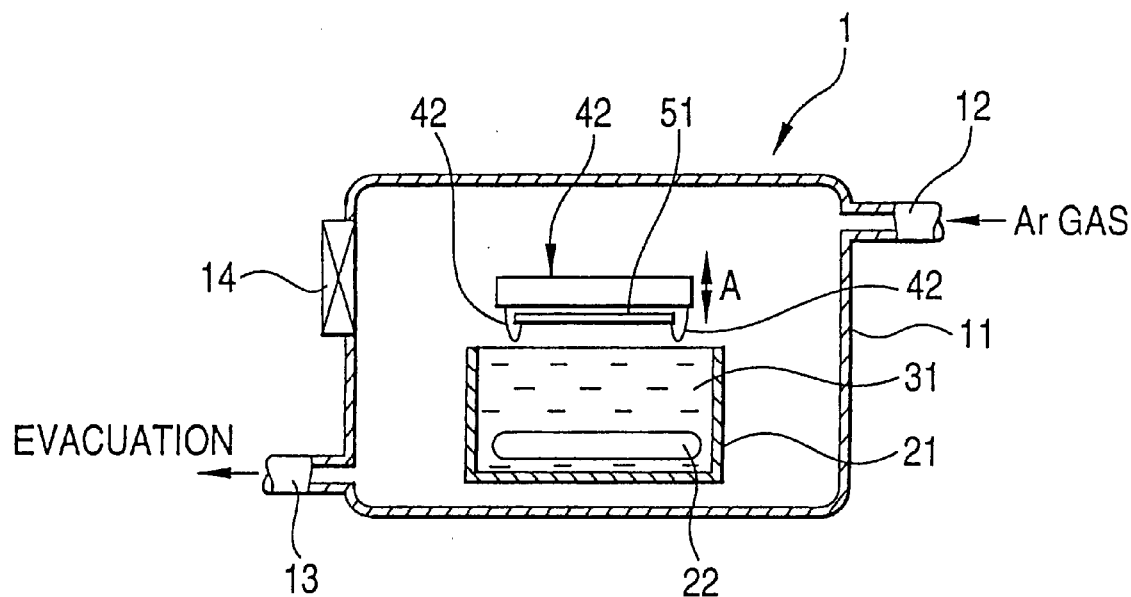
FIG. 5 is a schematic diagram showing the first embodiment of the apparatus for electroplating according to the invention.

As shown in FIG. 5, an apparatus for electroplating comprises a plating chamber 11 having an interior maintained with a non-oxidative atmosphere, a plating bath 21 provided inside the plating chamber 11, and means for holding a wafer 51 of a face down type.

The plating bath 21 contains a plating solution 31. An anode 22 is provided inside the plating solution 31. The plating bath 21 is also equipped with a supplying part and a discharging part (not shown in the figure) for the plating solution 31. The plating bath 21 may be a so-called circulating filtering system.

The means for holding a wafer 51 is tranportably provided by a driving unit not shown in the figure above the plating solution 31, and is freely movable in the direction A shown by the arrow in the figure. The means for holding a wafer 51 is equipped with a cathode 42, and the cathode 42 is connected to the surface to be plated (the lower surface in the figure) of the wafer 51. The anode 22 and cathode 42 are connected to a power source not shown in the figure.

The plating chamber 11 is equipped with a gas supplying part 12 for supplying a non-oxidative gas and a gas evacuation part 13 for evacuating the gas contained in the plating chamber 11. An argon (Ar) gas, for example, is filled in the plating chamber 11. The gas to be filled in the plating chamber 11 is not limited to an argon gas as far as it is a non-oxidative gas, and may be a-rare gas selected from helium, neon, argon, xenon and krypton, a nitrogen gas or a hydrogen gas. The plating chamber 11 preferably has an airtight structure, but may have such a constitution in that the path of the wafer 51 until immersing in the plating solution 31 is in the non-oxidative atmosphere. The plating chamber 11 is further equipped with a gate valve 14 for loading and unloading the wafer 51.

In the apparatus for electroplating 1 described above, because the plating bath 21 is provided in the plating chamber 11 containing the non-oxidative atmosphere, even when a bubble invades into the minute part, such as a concave part (not shown in the figure), e.g., a groove and a connecting hole, of the wafer 51 to be plated on immersing the wafer 51 into the plating solution 31 in the plating bath 21, so as to form a plated layer with the bubble becoming a void, the void contains a non-oxidative gas but does not contain oxygen. Therefore, the plated layer is not oxidized when the gas contained in the void is absorbed by the plated layer by subjecting the plated layer to the heat treatment to eliminate the void. Thus, increase in resistance and deterioration of reliability in the plated layer do not occur.

Figure 6:
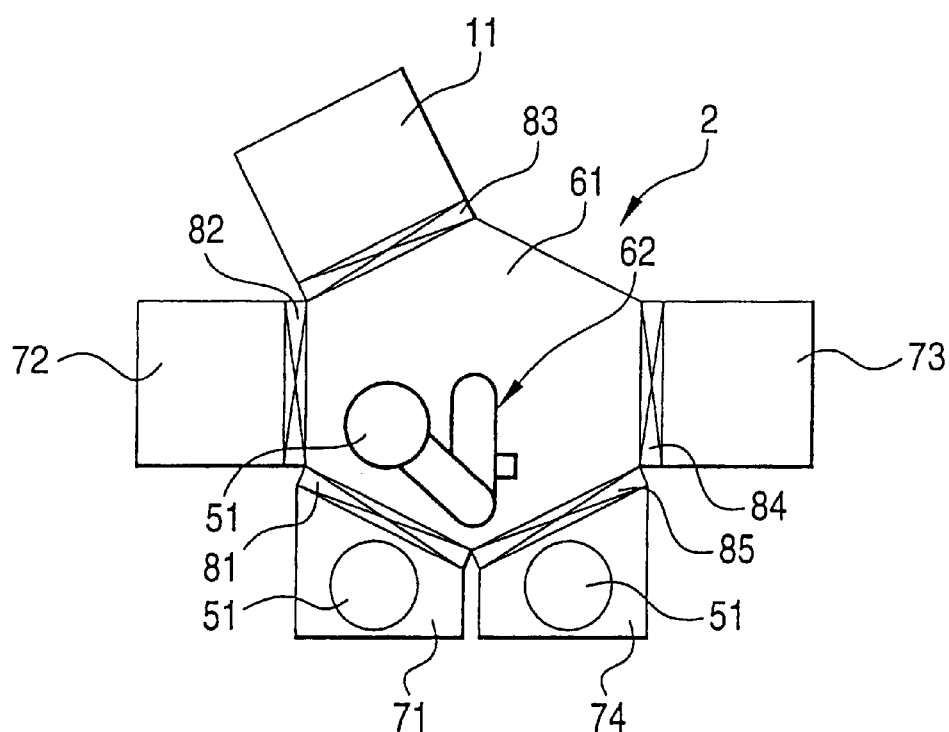
FIG. 6 is a schematic diagram showing the second embodiment of the apparatus for electroplating according to the invention.

The second embodiment of the apparatus for electroplating according to the invention will be described with reference to the schematic diagram shown in FIG. 6.

An apparatus for electroplating 2 has a constitution of a so-called multi-chamber type comprising a transportation chamber 61, as a central part, containing a transportation robot 62 for transporting a wafer 51, and-further comprises a wafer container on the loading side 71 containing a wafer 51 before treatment, a pre-treating chamber 72, a plating chamber 11 having the similar constitution as in the first embodiment, a post-treating chamber 73, and a wafer container on the unloading side 74, which are connected to the transportation chamber 61 via gate valves 81 to 85, for example. In this constitution, at least the plating chamber 11, the transportation chamber 61 and the pre-treating chamber 72 each are equipped with a supplying part and an evacuation part of the non-oxidative gas not shown in the figure to maintain the interior thereof at the non-oxidative atmosphere.

The non-oxidative atmosphere may comprise a rare gas selected from helium, neon, argon, xenon and krypton, a nitrogen gas or a hydrogen gas, as similar to the first embodiment.

In the apparatus for electroplating 2 described above, because the interior of the plating chamber 11, the transportation chamber 61 and the pre-treating chamber 72 is maintained at the non-oxidative atmosphere, the wafer having been subjected to the pre-treatment is transported to the plating chamber 11 without suffering oxidation, and subjected to the formation of a plated layer by electroplating. Therefore, even in the case where a plated layer comprising copper or a copper alloy, which are liable to be oxidized, oxidation does not occur from the pre-treatment to the electroplating, and thus a plated -layer having high reliability can be produced.

One embodiment of the method for electroplating according to the invention will be described with reference to FIGS. 7A to 7C, 8A and 8B. In these figures, for example, the method of forming a copper interconnection is shown.

Figure 7A:
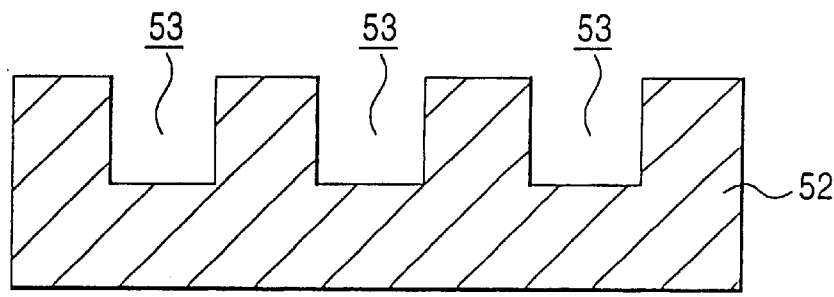
FIGS. 7A to 7C are schematic cross sectional views showing an embodiment of the method for electroplating according to the invention.

As shown in FIG. 7A, the formation of elements, for example, is conducted on a silicon substrate (not shown in the figure) by an ordinary LSI process, an interlayer insulating film 52 is the formed. Thereafter, a groove 53 is formed by an ordinary lithography technique and an etching technique (for example, an RIE (reactive ion etching)). In this embodiment, for example, the groove 53 has a width of 0.4 $\mu$m and a depth of 0.5 $\mu$m.

Figure 7B:
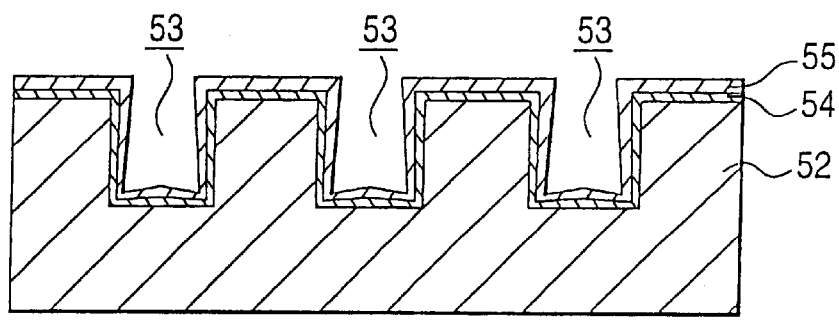

As shown in FIG. 7B, a barrier metal layer 54 as an underlayer is formed on the inner wall of the groove 53 and on the interlayer insulating film 52 by a magnetron sputtering method in high vacuum. The barrier metal layer 54 may be formed, for example, by forming a titanium film to a thickness of 20 nm and then a titanium nitride film is formed to a thickness of 50 nm.

As an example of the conditions for forming the titanium film, argon is used as a process gas (the supplying flow amount of which is 100 sccm, for example), the direct current power of the magnetron sputtering apparatus is 5 kW, the pressure of the sputtering atmosphere is 0.4 Pa, and the substrate temperature is 150° C. Hereinafter, the unit sccm means a volume flow amount ($cm^3$/min) under the normal state.

As an example of the conditions for forming the titanium nitride film, argon (the supplying flow amount of which is 30 sccm, for example) and nitrogen (the flow amount of which is 80 sccm, for example) are used as a process gas, the direct current power of the magnetron sputtering apparatus is 5 kW, the pressure of the sputtering atmosphere is 0.4 Pa, and the substrate temperature is 150° C.

Subsequent to the formation of the barrier metal layer 54, a copper layer to be a glue layer 55 is formed to a thickness of, for example, 20 nm by a magnetron sputtering method in high vacuum. As an example of the conditions for forming the glue layer 55, argon is used as a process gas (the supplying flow amount of which is 100 sccm, for example), the direct current power of the magnetron sputtering apparatus is 5 kW, the pressure of the sputtering atmosphere is 0.4 Pa, and the substrate temperature is 20° C.

The wafer 51 having been subjected to the process described above is transferred to the apparatus for electroplating 1 described with reference to FIG. 5, to conduct plating of copper on the wafer 51. In the following description, the same symbols will be used as in FIG. 5. Into the plating chamber 11 of the apparatus for electroplating 1, an argon gas, for example, is supplied in a flow-amount of 10 $dm^3$/min. While an argon gas is used for forming the non-oxidative atmosphere, it may be a rare gas, such as helium and neon, a nitrogen gas or a hydrogen gas. The wafer 51 is subjected to copper plating in the plating solution 31 exposed to the non-oxidative atmosphere.

As the conditions for the electroplating of copper, copper sulfate (the supplying flow amount of which is 67 $g/dm^3$, for example), sulfuric acid (the supplying flow amount of which is 170 $g/cm^3$, for example) and hydrochloric acid (the supplying flow amount of which is 70 ppm, for example) are used as the plating solution 31, and a surface active agent, as an additive, is added to the plating solution. The temperature of the plating solution 31 is 20° C., and the current is a direct current of 9 A (in the case of an 8-inch wafer).

Figure 7C:
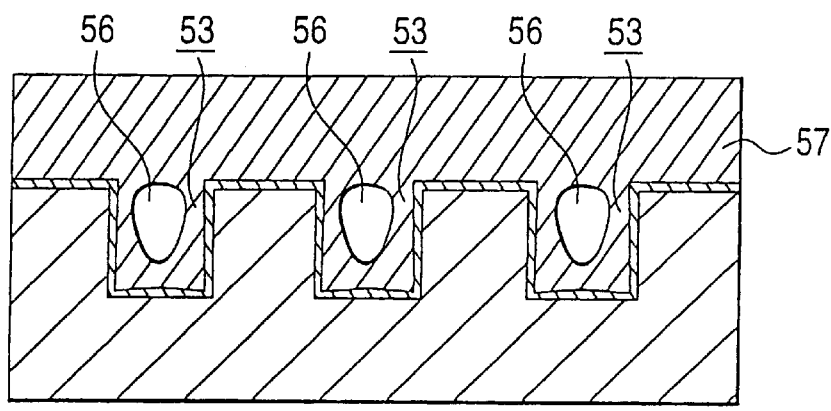

It is an important factor of the presence of a void remaining inside the groove or connecting hole on the electroplating as to whether or not the plating solution 31 is spread through the minute part (the interior of the groove or connecting hole). By using the apparatus for electroplating 1 according to the invention, even when a copper film 57 is formed with a void 56 remaining in the groove 53 as shown in FIG. 7C, the void 56 is filled with an inert gas.

Figure 8A:
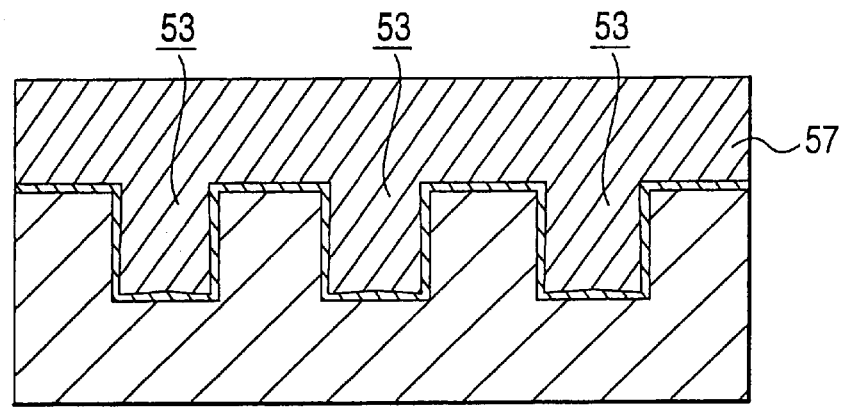
FIGS. 8A and 8B are schematic cross sectional views showing a continued part of the embodiment of the method for electroplating according to the invention.

Accordingly, it becomes possible that the void can be eliminated by the subsequent heat treatment of the copper film 57 without oxidation of the copper film 57, so as to bury the copper film 57 in the groove 53 as shown in FIG. 8A.

Figure 8B:
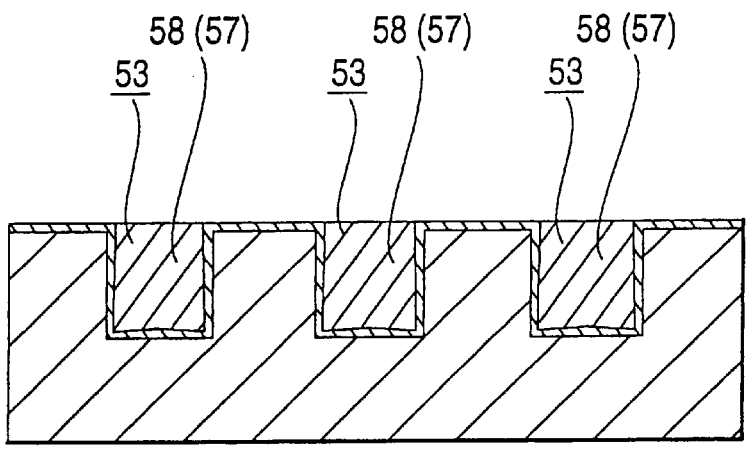

The copper film 57 (including the glue layer 55) and the barrier metal layer 54 at the position other than the part to be an interconnection groove are ground by chemical mechanical polishing (hereinafter referred to as CMP), to form an interconnection part 58 in the groove 53 as shown in FIG. 8B. As an example of the conditions for the CMP, a grinding pad comprising a non-woven cloth laminated with a polyurethane closed-cell foamed body (for example, IC1000/SUBA-IV Laminate, a trade name) is used, a slurry comprising alumina abrasive grain for grinding added with a hydrogen peroxide aqueous solution is used as a grinding slurry, the grinding pressure is 100 $g/cm^2$, the rotation number of the surface table is 30 rpm, the supplying amount of the grinding slurry is 100 $cm^3$/min, and the grinding temperature is from 25 to 30° C.

While copper is used as the interconnection material in this embodiment, gold, silver, aluminum, a gold alloy, a silver alloy a copper alloy and an aluminum alloy may be used as the interconnection material.

The electroplating in this embodiment may be conducted by using the apparatus 2 for electroplating apparatus of a multi-chamber type described with reference to FIG. 6. Accordingly, by using the non-oxidative atmosphere as not only the atmosphere of the plating chamber but also the atmospheres of the pre-treating chamber, the transportation chamber and the plating chamber, oxidation of the surface of the wafer after the pre-treatment can be prevented, and the adhesion property between the glue layer comprising copper and the copper film formed by the electroplating can be improved.

In this case, an argon gas, for example, is used as the non-oxidative gas, and its flow amount is 10 $dm^3$/min. As the non-oxidative gas, a gas containing no oxygen, such as a rare gas other then an argon gas, a nitrogen gas and a hydrogen gas may be used.

As described in the foregoing, according to the apparatus for electroplating of the invention, because the plating bath is provided in a non-oxidative atmosphere, even when a bubble invades into the minute part, such as a concave part, e.g., a groove and a connecting hole, of the article to be plated on immersing the article into a plating solution in the plating bath, so as to form a plated layer with the bubble becoming a void, the bubble is composed of an non-oxidative gas, and thus the void contains the non-oxidative gas. Therefore, the plated layer is not oxidized when the gas contained in the void is absorbed by the plated layer by the heat treatment, and increase in resistance and deterioration of reliability in the plated layer can be prevented.

According to the method for electroplating of the invention, because the article to be plated is immersed in the plating bath through a non-oxidative atmosphere, even when a bubble invades into the minute part, such as a concave part, e.g., a groove and a connecting hole, of the article to be plated on immersing the article into a plating solution in the plating bath, the bubble is composed of a non-oxidative gas. Therefore, when a plated layer with the bubble becoming a void, the void contains the non-oxidative gas. Therefore, the plated layer is not oxidized when the gas contained in the void is absorbed by the plated layer by the heat treatment, and increase in resistance and deterioration of reliability in the plated layer can be prevented.

What is claimed is:

1. A method for electroplating, comprising the steps of:
   pre-treating an article to be electroplated;
   transporting said article from a pre-treating zone; and
   electroplating said article by immersing said article in an electroplating bath provided in a non-oxidative atmosphere,
   wherein each of said steps of pre-treating, transporting and electroplating are carried out in said non-oxidative atmosphere.

2. A method for electroplating as claimed in claim 1, wherein
   said non-oxidative atmosphere is selected from the group consisting of a rare gas atmosphere, a nitrogen gas atmosphere and a hydrogen gas atmosphere.

3. A method for electroplating as claimed in claim 1, wherein from said immersing step a copper film is embedded in a groove or a connecting hole of said article, so that any voids formed in said copper film include said non-oxidative atmosphere.

4. A method for electroplating as claimed in claim 3, further including a step of heat treating said copper film without oxidation of said film.

5. A method for electroplating as claimed in claim 1, wherein a step of electroplating said article in said electroplating bath is carried out in said non-oxidative atmosphere.

6. A method for electroplating as claimed in claim 5, further including the steps of loading and unloading said article in said electroplating bath in said non-oxidative atmosphere.

7. A method for electroplating as claimed in claim 1, further including the steps of:
providing said electroplating bath, inside a plating chamber;
evacuating gas from said plating chamber; and
supplying a non-oxidative gas to said plating chamber.

* * * * *